US009670589B2

(12) United States Patent
Mann et al.

(10) Patent No.: US 9,670,589 B2
(45) Date of Patent: Jun. 6, 2017

(54) ALKALI URANIUM FLUOROPHOSPHATE-BASED CRYSTALS AND METHODS OF FABRICATION

(71) Applicant: The United States of America as Represented by the Secretary of the Air Force, Washington, DC (US)

(72) Inventors: James M Mann, Springboro, OH (US); Eric Hunt, Glen Rock, PA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/077,347

(22) Filed: Mar. 22, 2016

(65) Prior Publication Data

US 2016/0289860 A1 Oct. 6, 2016

Related U.S. Application Data

(60) Provisional application No. 62/139,993, filed on Mar. 30, 2015.

(51) Int. Cl.
*C01G 43/00* (2006.01)
*C30B 29/12* (2006.01)
(Continued)

(52) U.S. Cl.
CPC ............... *C30B 7/10* (2013.01); *C01B 25/45* (2013.01); *C01B 25/455* (2013.01);
(Continued)

(58) Field of Classification Search
CPC ... C01B 25/455; C01B 25/45; C01P 2002/77; C01P 2002/72; C01P 2002/76;
(Continued)

(56) References Cited

U.S. PATENT DOCUMENTS 4,980,141 A 12/1990 Kimura
7,211,234 B2 5/2007 Kolis
(Continued)

FOREIGN PATENT DOCUMENTS

WO 2010110729 9/2010

OTHER PUBLICATIONS

Doran et al. "[N2C6H14]2[(UO2)6(H2O)2F2(PO4)2(HPO4)4]—4H2O: A New Microporous Uranium Phosphate Fluoride", Chem. Mater. 2004, 16, 565-566.*
(Continued)

*Primary Examiner* — Anthony J Zimmer
*Assistant Examiner* — Syed Iqbal
(74) *Attorney, Agent, or Firm* — AFMCLO/JAZ; Chastity Whitaker

(57) ABSTRACT

A method of synthesizing alkali uranium fluorophosphate crystals. The method includes combining a uranium-based feedstock with a mineralizer solution. The mineralizer solution includes an alkali nutrient, a phosphate, and a fluoride. The feedstock and mineralizer solution are pressurized and a thermal gradient applied thereto such that a first portion of the feedstock and the mineralizer solution is heated to a temperature that is greater than a temperature of a second portion of the feedstock and the mineralizer solution. Uranium nutrient enters the mineralizer solution from the feedstock in the first portion and uranium nutrient precipitates to spontaneously form crystals in the second portion.

18 Claims, 11 Drawing Sheets

(51) Int. Cl.
*C30B 7/14* (2006.01)
*C30B 7/10* (2006.01)
*C01G 43/06* (2006.01)
*C01B 25/45* (2006.01)
*C09K 11/77* (2006.01)
*C30B 29/14* (2006.01)
*C01G 43/025* (2006.01)
*C30B 29/16* (2006.01)
*C01B 25/455* (2006.01)

(52) U.S. Cl.
CPC ......... *C01G 43/006* (2013.01); *C01G 43/025* (2013.01); *C01G 43/06* (2013.01); *C09K 11/7709* (2013.01); *C30B 7/14* (2013.01); *C30B 29/12* (2013.01); *C30B 29/14* (2013.01); *C30B 29/16* (2013.01); *C01P 2002/72* (2013.01); *C01P 2002/76* (2013.01); *C01P 2002/77* (2013.01); *C01P 2006/60* (2013.01)

(58) Field of Classification Search
CPC . C01P 2006/60; C01G 43/025; C01G 43/006; C01G 43/06; C30B 7/14; C30B 29/16; C30B 29/14; C30B 7/10; C30B 29/12; C09K 11/7709
See application file for complete search history.

(56) References Cited

U.S. PATENT DOCUMENTS 7,563,320 B2  7/2009  Kolis
8,485,983 B2  7/2013  Gouma
2009/0060813 A1  3/2009  Burton

OTHER PUBLICATIONS

Hermens et al. "Synthesis of metal fluorouranate(IV) compounds in aqueous solution" Journal of Fluorine Chemistry 77 (1996) 13-14.*

M. Mann et al., "Hydrothermal Growth and Thermal Property Characterization of ThO2 single crystals," Crystal Growth and Design, vol. 10 (2010) 2146-2151.

M. Mann and J. Kolis, "Synthesis and Structural Characterization of K3Th2(PO4)3F2 and RbThPO4F2 as Potential Nuclear Waste Storage Materials," J. Chem. Crystallog., vol. 40 (2010) 337-342.

M. A. Salvado et al., "Phosphorous Acid and Urea: Valuable Sources of Phosphorus and Nitrogen in the Hydrothermal Synthesis of Ammonium-Thorium Phosphates," Inorganic Chemistry, vol. 47 (2008) 7207-7210.

Jean-Claude Petit. Natural analogues for the design and performance assessment of radioactive waste forms: A review, Journal of Geochemical Exploration, vol. 46, Issue 1, Nov. 1992, pp. 1-33, ISSN 0375-6742.

A. Guesdon et al., "New thorium and uranium monophosphates in the KTh2(PO4)3 family: structure and cationic non-stoichiometry," J. Mater. Chem., vol. 9 (1999) 2583-2587.

D. J. Singh et al., "Applications of first principles theory to inorganic radiation detection materials," Mater. Res. Soc. Symp. Proc., vol. 1038 (2008) 9 pages total.

* cited by examiner

ALKALI URANIUM FLUOROPHOSPHATE-BASED CRYSTALS AND METHODS OF FABRICATION

Pursuant to 37 C.F.R. §1.78(a)(4), this application claims the benefit of and priority to prior filed co-pending Provisional Application Ser. No. 62/139,993, filed Mar. 30, 2015, which is expressly incorporated herein by reference.

RIGHTS OF THE GOVERNMENT

This invention was made with government support under DMR-0907395 awarded by the National Science Foundation. The Government has certain rights in the invention.

The invention described herein may be manufactured and used by or for the Government of the United States for all governmental purposes without the payment of any royalty.

FIELD OF THE INVENTION

The present invention relates generally to uranium-based crystals and, more particularly, to methods of synthesizing crystals thereof.

BACKGROUND OF THE INVENTION

Neutron detection has a range of applications, including nuclear reactor monitoring, materials science research, nuclear material detection, and nuclear material forensics. Scintillators, materials that absorb energy from incoming radiation and emit photons when the scintillator returns to its original energy state, are used in one method of neutron detection. Conventional scintillators, which are generally inorganic crystals, are hygroscopic and require protection from atmospheric conditions to avoid degradation. Therefore, materials containing uranium oxide or actinide phosphate, such as, $RbUPO_4F_2$ and $CsUPO_4F_2$, have been considered promising as state-of-the-art scintillators because of their characteristic high density, optical clarity, and stability when exposed to atmospheric conditions. Yet, synthesis of single crystals of these new materials has, to date, been unsuccessful.

Moreover, certain uranium oxide or actinide phosphate crystals, particularly $RbUPO_4F_2$ and $CsUPO_4F_2$, have the potential to incorporate large quantities of radionuclides into their crystal structures. In-fact, it has been hypothesized that the structure of these two materials may lend itself to the replacement of the rubidium or cesium atomic sites with cesium-137 or strontium-90 radioisotopes. By incorporating these radioisotopes directly into the crystal structure, it is believed that resultant materials may be radiation-damage resistant solid to contain radioactive wastes without the threat of leaking or degradation over time. Again, as noted above, synthesis of these single crystals of actinide phosphate has, to date, been unsuccessful.

Conventional radioactive waste undergoes a vitrification process, which incorporates the waste into a glass structure. A borosilicate glass material is commonly used for this process, but is largely inadequate because of a lack of stability when exposed to radiation for extended periods. When the structure of the glass material become unstable, the glass structure is less effective in containing radioactive wastes. Some have hypothesized that phosphate structures of $RbUPO_4F_2$ and $CsUPO_4F_2$ have the potential to render such radioactive waste stable with regards to temperature and chemical exposure. Similarly, with the incorporation of the uranium in the structure, it also makes it extremely likely that these materials will be stable when exposed to radiation for extended periods. With a large amount of nuclear wastes produced each year by medical, industrial, and military processes, these materials would fill a large void that exists in current radioactive waste storage and disposal technology.

Finally, some uranium based single crystals may be useful as a nuclear fuel in a molten salt reactor process.

Uranium-based crystals may, therefore, be used for a plurality of reasons, not limited to those herein. Yet, to date, bulk substrate of single uranium-based crystals is difficult to achieve. This difficulty lies in that, traditionally, high temperatures (in excess of 1000° C.) are needed for crystal growth: that is, in excess of 3000° C. for a skull melting technique and in excess of 1000° C. for both flux growth and chemical vapor transport.

Thus, there remains a need for methods of growing single, bulk substrate of uranium-based crystals of high purity, significant size, and high quality.

SUMMARY OF THE INVENTION

The present invention overcomes the foregoing problems and other shortcomings, drawbacks, and challenges of conventional crystal growth. While the invention will be described in connection with certain embodiments, it will be understood that the invention is not limited to these embodiments. To the contrary, this invention includes all alternatives, modifications, and equivalents as may be included within the spirit and scope of the present invention.

According to an embodiment of the present invention, a method of synthesizing rubidium uranium fluorophosphate crystals includes combining a uranium-based feedstock with a mineralizer solution. The mineralizer solution includes an alkali nutrient, a phosphate, and a fluoride. The feedstock and mineralizer solution are pressurized and a thermal gradient applied thereto such that a first portion of the feedstock and the mineralizer solution is heated to a temperature that is greater than a temperature of a second portion of the feedstock and the mineralizer solution. Uranium nutrient enters the mineralizer solution from the feedstock in the first portion and uranium nutrient precipitates to spontaneously form crystals in the second portion.

According to other embodiments of the present invention, a method of synthesizing rubidium uranium fluorophosphate crystals includes combining a uranium-based feedstock with a mineralizer solution. The mineralizer solution includes a rubidium nutrient, a phosphate, and a fluoride. The feedstock and mineralizer solution are pressurized and a thermal gradient applied thereto such that a first portion of the feedstock and the mineralizer solution is heated to a temperature that is greater than a temperature of a second portion of the feedstock and the mineralizer solution. Uranium nutrient enters the mineralizer solution from the feedstock in the first portion and uranium nutrient precipitates to spontaneously form crystals in the second portion.

Still other embodiments of the present invention include a method of synthesizing cesium uranium fluorophosphate crystals in which a uranium-based feedstock and a mineralizer solution are combined. The uranium-based feedstock includes uranium dioxide; the mineralizer solution includes a cesium nutrient, a phosphate, and a fluoride. The feedstock and mineralizer solution are pressurized and a thermal gradient is applied thereto such that a first portion of the feedstock and the mineralizer solution is heated to a temperature that is greater than a temperature of a second portion of the feedstock and the mineralizer solution. Uranium nutrient enters the mineralizer solution from the feedstock in the first portion and uranium nutrient precipitates to spontaneously form crystals in the second portion.

Objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
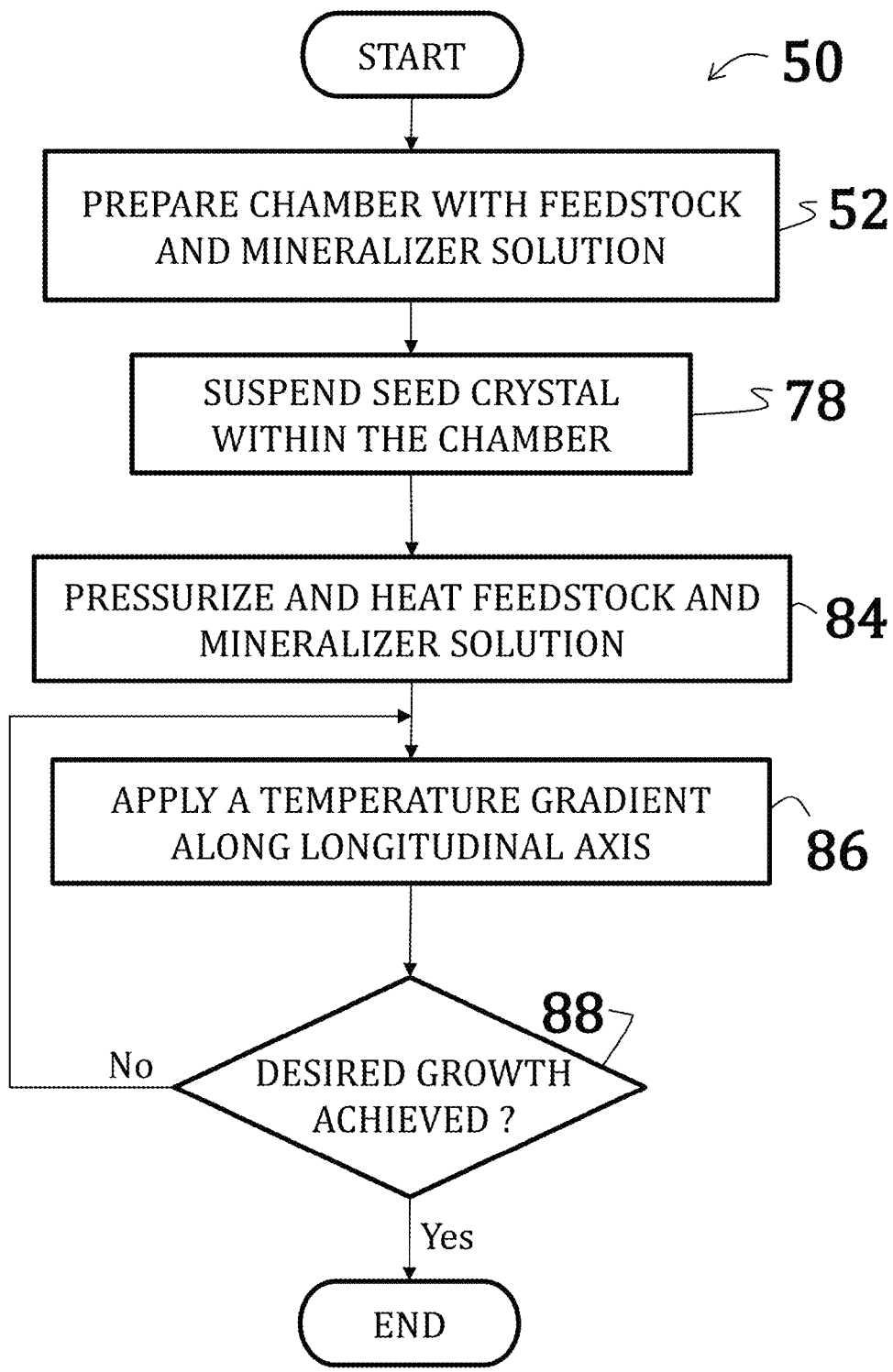
FIG. 1 is a flowchart illustrating a method of synthesizing uranium-based crystals in accordance with an embodiment of the present invention.

Referring now to the figures, and in particular to FIG. 1, a flowchart illustrating a method 50 of synthesizing single crystals according to an embodiment of the present invention is described. In Block 52, a chamber 54 within a pressurizable reaction device 56 (FIG. 2) is prepared with a feedstock and a mineralizer solution (collectively illustrated as solution 57 in FIG. 2A).

Composition of the feedstock and the mineralizer solution depend, in part, of the desired crystal yielded. The feedstock may be powdered or polycrystalline and provide nutrient for crystal growth. For uranium-based crystals, uranium dioxide ($UO_2$), uranium tetrafluoride ($UF_4$), uranium tetrachloride ($UCl_4$), triuranium octoxide ($U_3O_8$), or uranium trioxide ($UO_3$) may be used. The mineralizer solution, generally used for dissolution of nutrient, formation of spuriously nucleated single crystals, or both, may be generally comprised of an alkali hydroxides, ammonium hydroxide, alkali halides, alkali carbonates, alkali fluorides, and mixtures thereof Mineralizer solutions have concentrations ranging from about 0.1 M to about 30 M.

TABLE 1

| CRYSTAL | SEED CRYSTAL (if any) | FEEDSTOCK | MINERALIZER SOLUTION |
|---|---|---|---|
| $UO_2$ | $UO_2$ $CaF_2$ | $UO_2$ $UF_4$ $UCl_4$ $U_3O_8$ $UO_3$ | CsF Alkali hydroxides Ammonium hydroxide Alkali halides Alkali carbonates RbF with RbOH |
| $RbUPO_4F_2$ | | $UO_2$ | $RbH_2PO_4$ with RbF |
| $CsUPO_4F_2$ | | $UO_2$ | $CsH_2PO_4$ with CsF |
| $Rb_7U_6F_{31}$ | | $UO_2$ | RbF |
| $RbUF_5$ | | $UF_4$ $UCl_4$ | RbF + RbOH RbF + HF |

Figure 2:
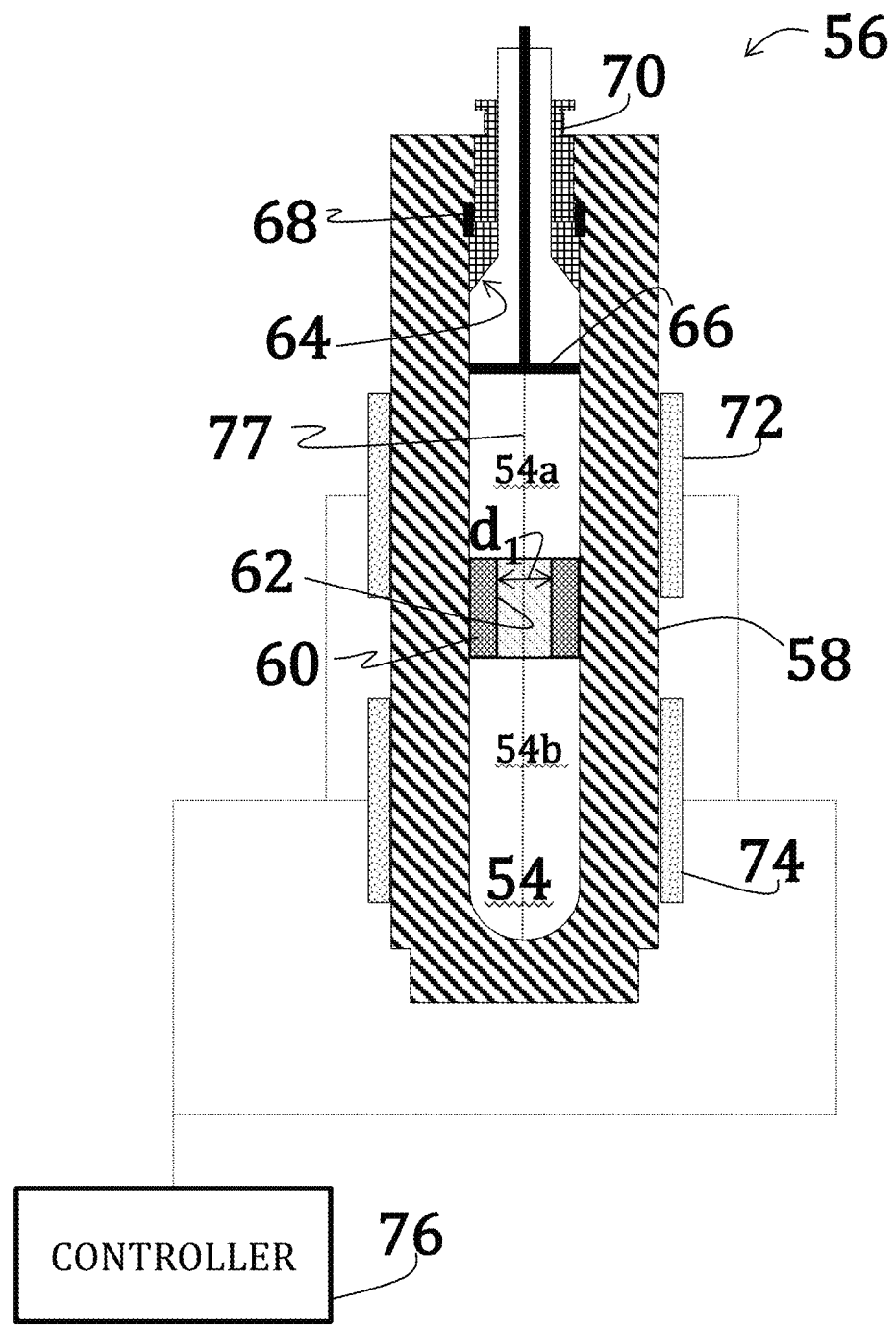
FIG. 2 is a side elevational view of an autoclave, shown in cross-section, suitable for performing the method of FIG. 1 according to embodiments of the present invention.

The exemplary pressurizable reaction device 56 illustrated in FIG. 2 is an autoclave; however, those skilled in the art having the benefit of the disclosure provided herein would readily appreciate that the illustrated structure is nonlimiting. The autoclave 56 includes a wall 58 enclosing the chamber 54, which may be separated into upper and lower regions 54a, 54b by a baffle 60. The baffle 60 may be constructed from any inert material, for example, a precious metal, and includes an opening 62 therein having a diameter, d1, selected to permit fluid communication therethrough ranging from about 15% to about 45%. In this way, the baffle 60 permits fluidic communication between the upper and lower regions 54a, 54b of the chamber 54 while maintaining these regions 54a, 54b as separate. Although the baffle 60 is illustrated as having a single opening 62, it would be readily understood that more than one opening may be used. In-fact, according to some embodiments of the present invention, the baffle 60 may be porous or comprise a mesh material, for example.

The chamber 54 is accessible through an open end 64, into which a plug 66 and seal 68 may be inserted before pressurizing the chamber 54 and secured with a locking collar.

Externally, heaters 72, 74 (two are shown) at least partially surround the wall 58 of the autoclave 56, each corresponding to a respective one of the upper and lower chambers 54a, 54b. The heaters 72, 74 are operably coupled to a controller 76, which may be configured to operably control the heaters 72, 74 such that the upper chamber 54a may be heated to a temperature that is different from a temperature of the lower chamber 54b. Said another way, the heaters 72, 74 may be operated so as to form a temperature gradient between the upper and lower chambers 54a, 54b. According to embodiments of the present invention, and as described in great detail below, the temperature gradient variation may range from about 2° C. to about 80° C.

The heaters 72, 74 may have any suitable structure, form, or number. Particularly, and as shown, band heaters 72, 74 are used to circumferentially surround the 58 and chamber 54 therein. Other constructions and methods may be used, so long as a temperature difference exists along a longitudinal axis 77 of the chamber 54 of the autoclave 56.

Figure 2A:
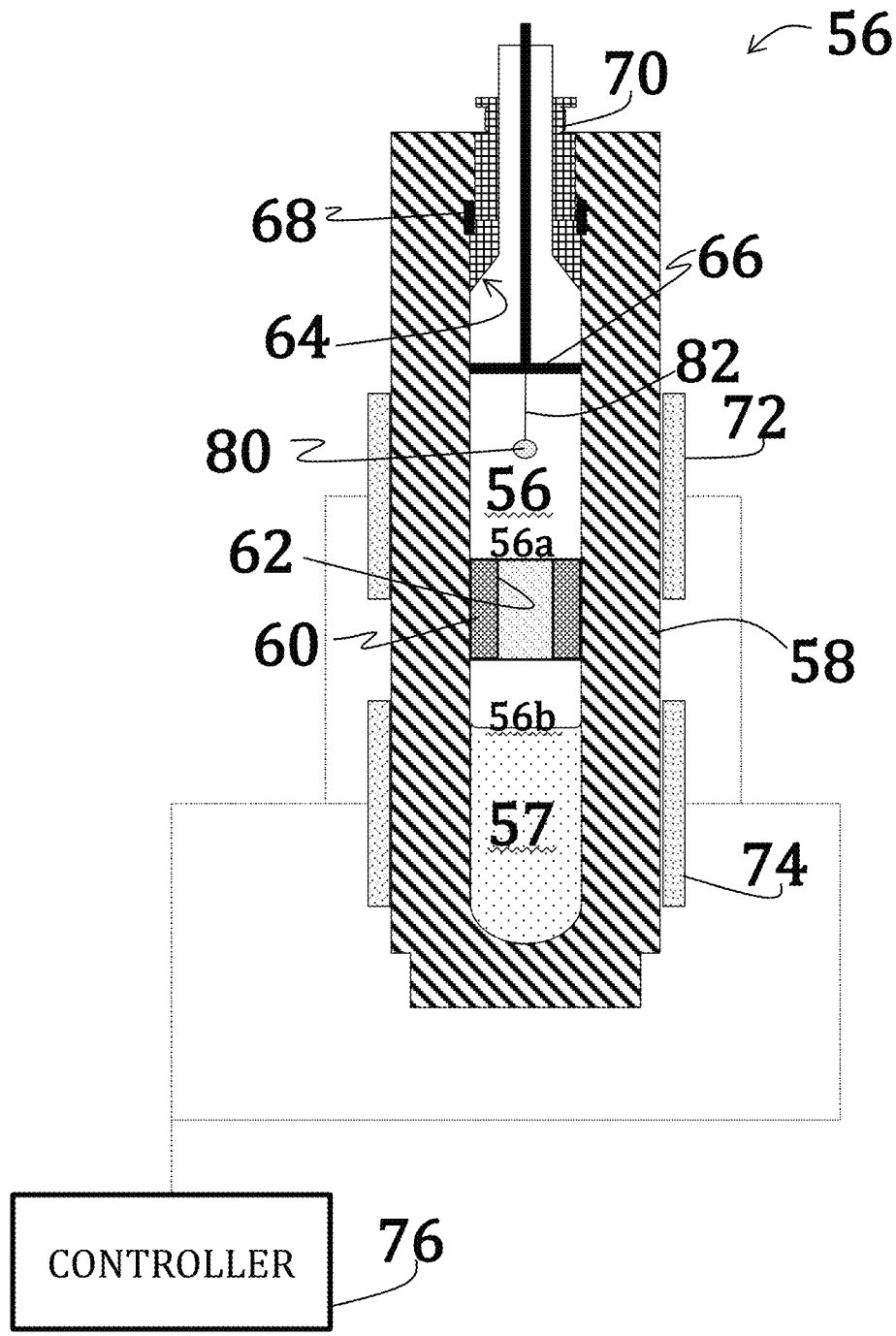
FIG. 2A is a side elevational view of an autoclave, shown in cross-section, suitable for performing the method of FIG. 1 according to another embodiment of the present invention.

Referring again to FIG. 1, with reference to FIG. 2A, and with the feedstock and mineralizer solution (collectively illustrated as liquid 57) prepared within the chamber 54, a seed crystal 80 may then be suspended within the upper chamber 54a (Block 78). The crystal suspension 82 may include wires, clamps, and woven wire mesh constructed from an inert material, such as a precious metal.

If necessary, although not shown, de-ionized water may be added to the chamber 54 such that a total volume of solution 57 and water occupies about 40% to about 95% of the chamber's internal volume.

Continuing with FIGS. 1 and 2, the chamber 54 of the autoclave 56 may then be sealed, pressurized (for example, 25,000 psi, but generally ranging from about 10,000 psi to about 30,000 psi), and heated (Block 84). In Block 86, a temperature gradient is formed along the longitudinal axis 77 of the chamber 54. In that the lower chamber 54b may be heated to a temperature greater than about 600° C. This high temperature causes a partial amount of the uranium nutrient/feedstock to enter the mineralizer solution. Concurrently, the upper chamber 54a may be heated to a temperature greater than about 550° C. but less than the temperature of the lower chamber 54b. At the lower temperature, the solubility of nutrient in the mineralizer solution is reduced and, resultantly, nutrient will precipitate out of solution and spontaneously grow crystals onto the seed crystal 80 (FIG. 2A). More generally, the maximum temperature may range from about 400° C. to about 750° C., with the thermal gradient ranging from about 2° C. to about 80° C.

Heating and crystallization continue ("No" branch of decision block 88) until a final crystal is achieved and having one or more of a desired purity, a desired quality, and a desired size. While these characteristics of the final crystal are at least partially dependent on reaction duration, generally crystal growth continues for about 7 days to about 90 days.

When the desired growth is achieved ("Yes" branch of decision block 88), the process ends, the heat and pressure are removed from the chamber 54 such that crystal may be retrieved.

According to some alternative embodiments, the thermal gradient need not be applied nor maintained. Instead, crystal growth may be found favorable using an isothermal temperature.

Figure 3:
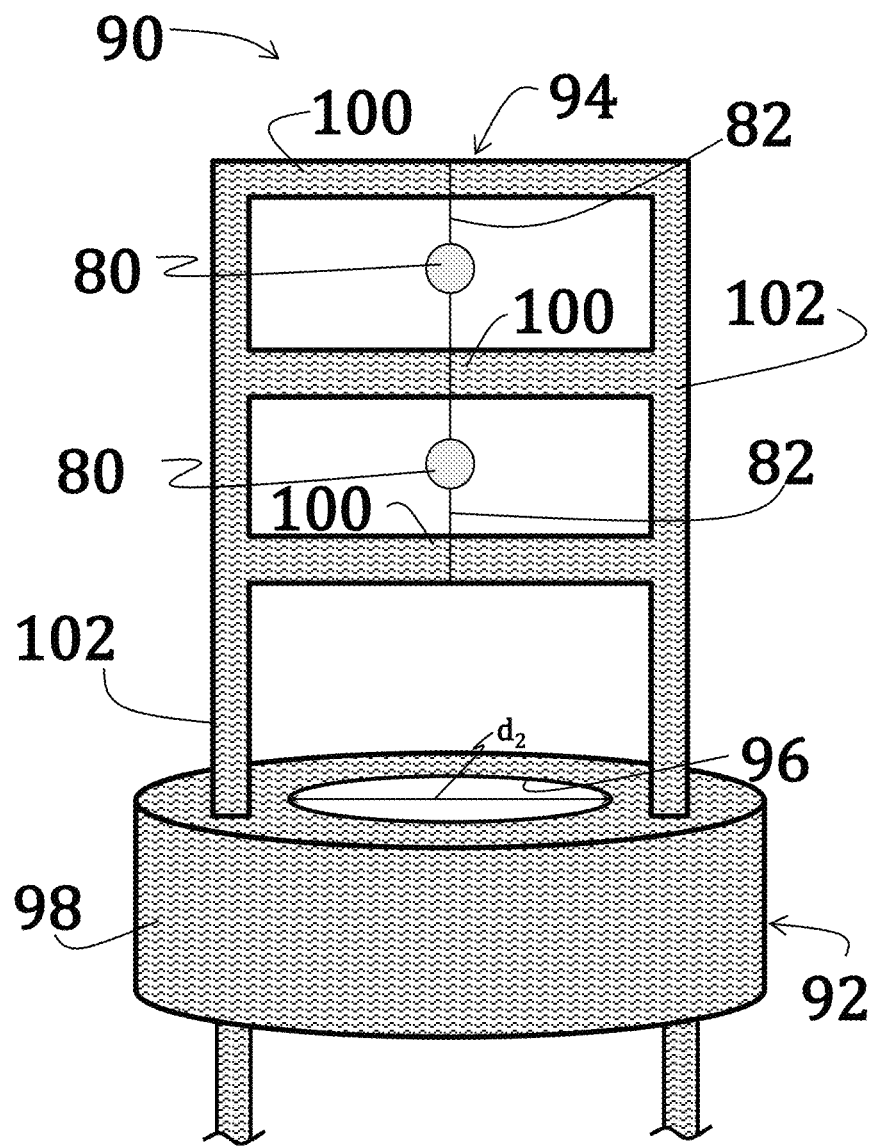
FIG. 3 is a side elevational view of a seed rack ladder suitable for use in synthesizing uranium oxide crystals in accordance with some embodiments of the present invention.

According to some embodiments of the present invention, the use of one or more seed crystal 80 may be required or desired. In that regard, and with reference to FIG. 3, a baffle-based seed ladder 90 is shown. The baffle-based seed ladder 90 includes a baffle portion 92 and a ladder portion 94 and, thus, may comprise a unitary construction or, alternatively, may be separately constructed and joined together. As was noted above, the construction may include any inert material, for example, precious metals.

The baffle portion 94 includes an opening 96 within a main body 98 having a diameter, $d_2$, selected to permit fluid communication therethrough ranging from about 15% to about 45% and so as to permit fluidic communication between the upper and lower regions 54a, 54b (FIG. 2) of the chamber 54 (FIG. 2) while maintaining these regions 54a, 54b (FIG. 2) as separate.

The ladder portion 94 includes a one or more rungs 100 (three rungs 100 are shown) extending from vertical supports 102. Seed crystals 80 (two seed crystals 80 are shown) are positioned between adjacent ones of the rungs 100 by at least one suspension 82, which may be similar to the suspensions discussed in detail above.

Use of the baffle-based seed ladder 90 may provide the benefit of growing more than one crystal at a time in accordance with embodiments of the present invention as described in detail here.

Figure 4:
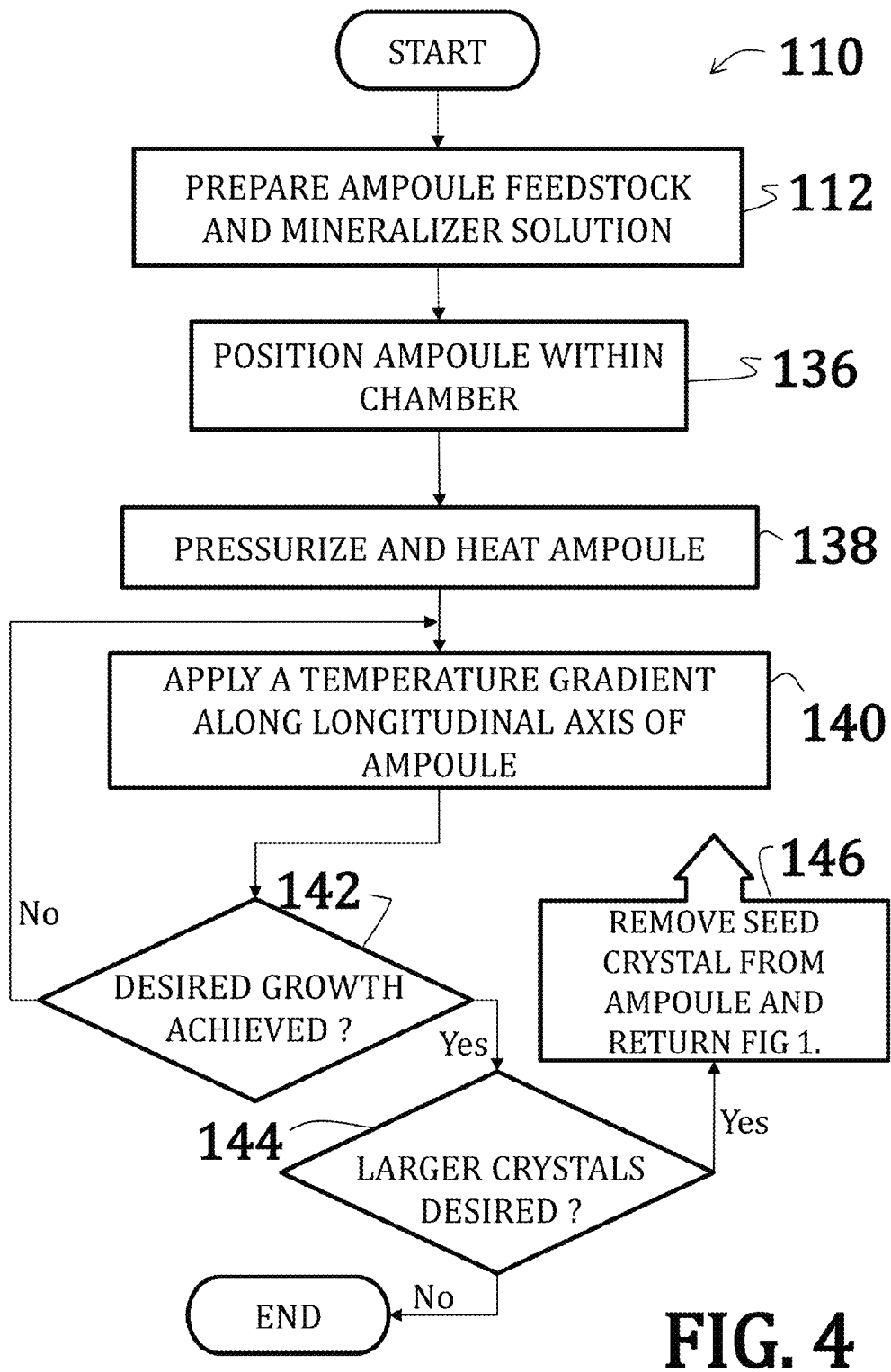
FIG. 4 is a flowchart illustrating a method of synthesizing uranium-based seed crystals in accordance with another embodiment of the present invention.
Figure 5:
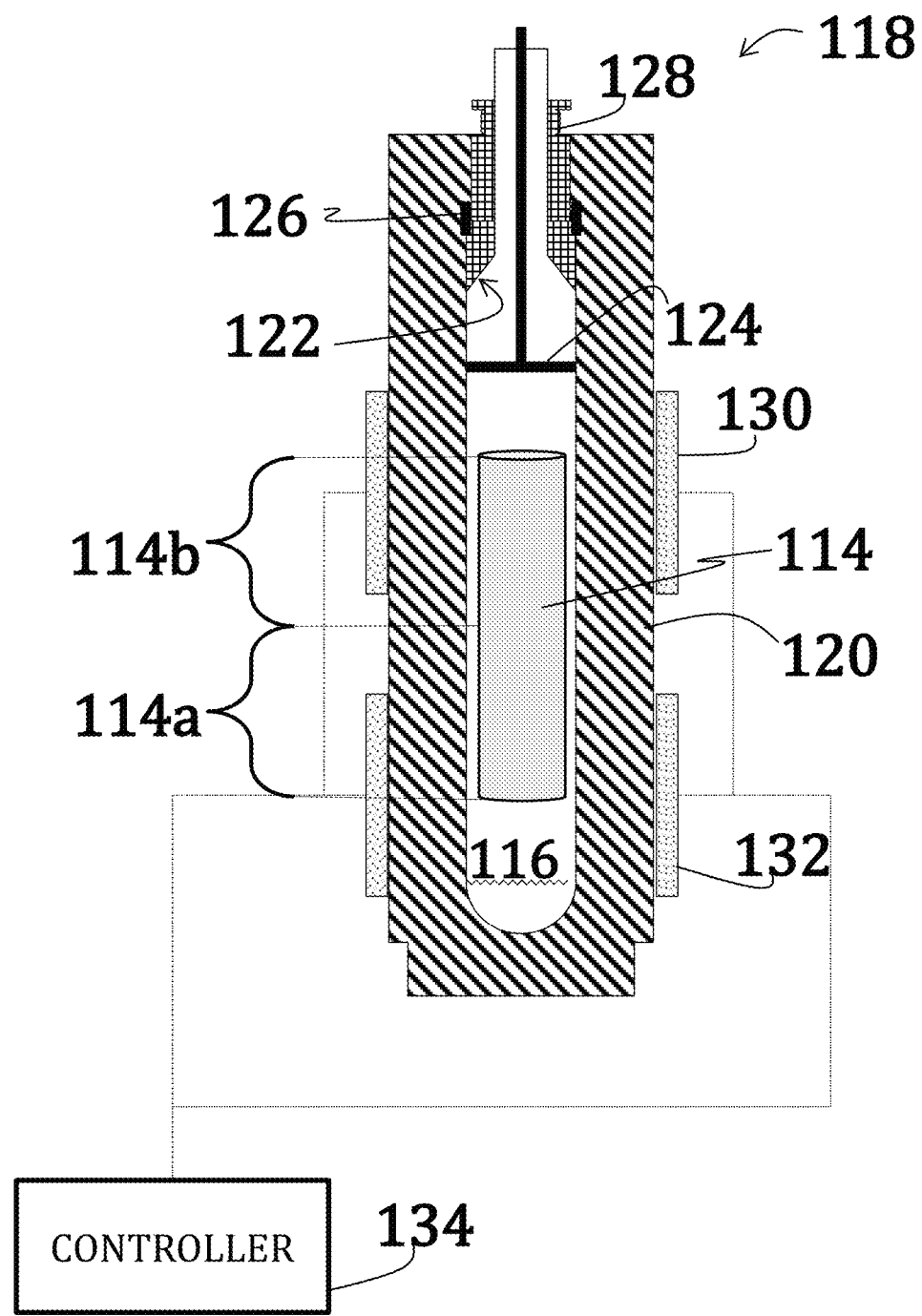
FIG. 5 is a side elevational view of an autoclave, shown in cross-section, suitable for performing the method of FIG. 4 according to embodiments of the present invention.

Turning now to FIGS. 4 and 5, a method of forming crystals according to another embodiment of the present invention is shown. In Block 112, an ampoule 114 configured to be positioned within a chamber 116 of a pressurizable reaction device 118 is prepared with a feedstock and a mineralizer solution. As described previously, the composition of the feedstock and the mineralizer solution depends, in part, of the desired crystal yielded and may be selected in accordance with the parameters set forth above. Again, mineralizer solutions may have concentrations ranging from about 0.1 M to about 30 M.

The exemplary pressurizable reaction device 118 illustrated in FIG. 5 is similar to the autoclave 56 of FIG. 2; however, those skilled in the art having the benefit of the disclosure provided herein would readily appreciate that the illustrated structure is nonlimiting. Here, the device 118 includes a wall 120 enclosing the chamber 116. The chamber 116 is accessible through an open end 122, into which a plug 124 and seal 126 may be inserted before pressurizing the chamber 116 and secured with a locking collar 128.

Externally, heaters 130, 132 (two are shown), similar to those described above, at least partially surround the wall 120 of the device 118. The heaters 130, 132 may be operably controlled by a controller 134 such a temperature gradient is created along a longitudinal axis 77 (FIG. 2) of the chamber 116. According to embodiments of the present invention, and as described in great detail below, the temperature gradient variation may range from about 2° C. to about 80° C.

The ampoule 114 may be constructed of a precious metal (silver, gold, platinum, or palladium, for example) and, according to some embodiments of the present invention, may comprise a metal tubing, such as those commercially-available from by Refining Systems, Inc. (Las Vegas, Nev.) and having one end welded or otherwise closed to retain the feedstock and the mineralizer solution therein.

Referring again to Block 112, the feedstock and the mineralizer solution are added to the ampoule 114 until a combined total of the feedstock and mineralizer solution within the ampoule is set to occupy a majority percentage (ranging from about 40% to about 90%) of the ampoule's total volume. The ampoule 114 may then be sealed (for example, by welding any open end) and is positioned within the chamber 116 of the device 118 of FIG. 5 (Block 136). If necessary, although not shown, de-ionized water may be added to the chamber 116 such that a total volume of ampoule 114 and water occupies about 65% to about 90% of the chamber's internal volume.

Continuing with FIGS. 4 and 5, the chamber 116 of the device 118 may then be sealed, pressurized (for example, 25,000 psi, but generally ranging from about 10,000 psi to about 30,000 psi), and heated (Block 138). In Block 140, a temperature gradient is formed along the longitudinal axis 77 (FIG. 2) of the chamber 116, which may generally coincide with a longitudinal axis (not shown) of the ampoule 114. In that regard, the ampoule 114 will have a lower region 114a heated to a temperature that is greater than a temperature of an upper region 114b. It should be readily appreciated that the terms "lower" and "upper" are merely used as directional reference herein with respect to FIG. 5 and should not be considered to be limiting.

According to some embodiments, the highest temperature of the ampoule 114 at the lower region 114a will be greater than about 600° C. At this high temperature, uranium nutrient/feedstock enters the mineralizer solution. The upper region 114b may then heated to a temperature greater than about 550° C. but less than the temperature of the lower chamber 54b. At the lower temperature, the solubility of nutrient in the mineralizer solution is reduced and, resultantly, nutrient will precipitate out of solution and spontaneously form spontaneously crystals on an inner wall (not shown) of the ampoule 114). More generally, the maximum temperature may range from about 400° C. to about 750° C., with the thermal gradient ranging from about 2° C. to about 80° C.

Heating and crystallization continue ("No" branch of decision block 142) until a desired growth is achieved. While the final size of the crystal is dependent on reaction duration, generally crystal growth continues for about 7 days to about 90 days.

When the desired growth is achieved ("Yes" branch of decision block 142), a decision is made as to whether larger crystals are desired (Decision block 144). If larger crystals are desired ("Yes" branch of decision block 144), then heat and pressure are removed from the chamber 116, the ampoule 114 opened, and a small crystal may be extracted from the inner wall of the ampoule 114 (Block 146). The small, extracted crystal may then be used as a seed crystal in the method 50 (FIG. 1) described above. Otherwise ("No" branch of decision block 144), the process ends, the heat and pressure are removed from the chamber 116 and the ampoule 114 opened such that crystals may be retrieved.

Figure 6:
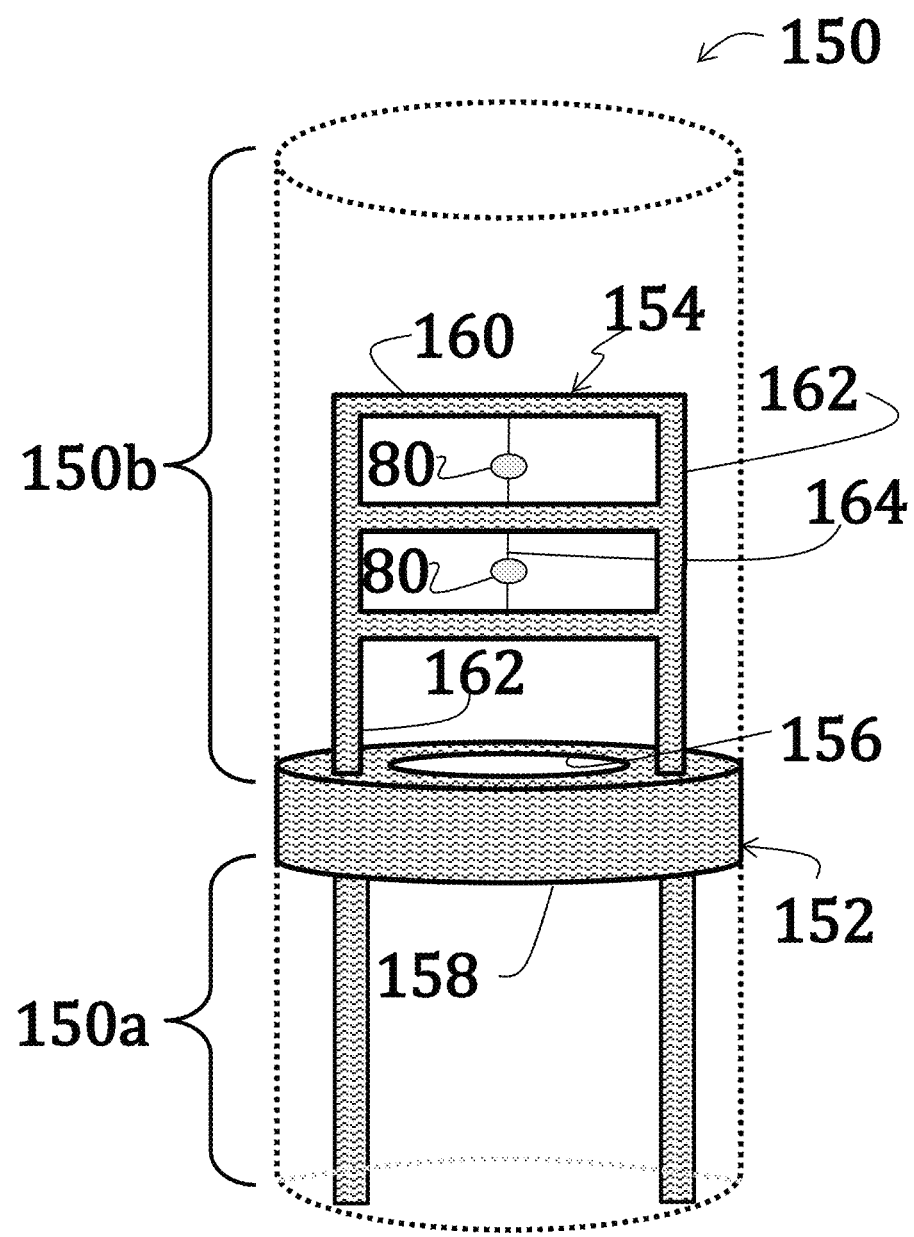
FIG. 6 is a side elevational view of an exemplary ampoule suitable for use in synthesizing uranium oxide crystals in accordance with some embodiments of the present invention.

Similar to the alternate embodiment described above, an ampoule 150, used in accordance with methods described herein, may further comprise a baffle 152, with or without a seed ladder 154, the latter of which is shown in FIG. 6 (the ampoule 150 being in phantom). The baffle 152 with ladder 154 may comprise a unitary construction of an inert material (such as a precious metal) or, alternatively, may be separately constructed and joined together. As was noted above, the construction may include any inert material, for example, precious metals.

The baffle 152 includes an opening 156 within a main body 158 having a diameter selected to permit fluid communication therethrough ranging from about 15% to about 45% and so as to permit fluidic communication between the upper and lower regions 150b, 150a of the ampoule 150 while maintaining these regions 150b, 150a as separate.

The seed ladder 154 includes a one or more rungs 160 (three rungs 160 are shown) extending from vertical supports 162. Seed crystals 80 (two seed crystals 80 are shown) are positioned between adjacent ones of the rungs 160 by at least one suspension 164, which may be similar to the suspensions discussed in detail above. In this way, more than one seed crystal 80 may be used for growing crystals.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

EXAMPLE 1

Uranium dioxide crystals were synthesized by placing a powdered or polycrystalline nutrient/feedstock of $UO_2$ in a lower heating zone of a silver ampoule. A seed crystal of $UO_2$ was suspended in the upper heating zone of the ampoule on a seed rack, similar to the embodiment illustrated in FIG. 6. A 6 M cesium fluoride mineralizer solution was added to fill 70% of the ampoule. A baffle comprising a precious metal was positioned between the lower heating zone and the upper heating zone of the ampoule. The ampoule was then welded shut and placed within a reaction chamber with water (enough to the 75% to 80% fill level) of an autoclave (similar to the embodiment illustrated in FIG. 5).

Band heaters on the autoclave were operated to maintain the lower heating zone at about 600° C. and the upper heating zone at about 550° C. A growth pressure of about 25,000 psi was maintained. Growth continued for 14 days.

New growth of $UO_2$ crystalline material was deposited on the seed crystal, which enlarged the seed crystal by approximately 1 mm in each dimension.

EXAMPLE 2

Uranium dioxide crystals were synthesized by placing a powdered or polycrystalline nutrient/feedstock of $UO_2$ in a lower heating zone of a silver ampoule. A 9 M cesium fluoride mineralizer solution was added to fill 70% of the ampoule. A baffle comprising a precious metal was positioned between the lower heating zone and the upper heating zone of the ampoule. The ampoule was then welded shut and placed within a reaction chamber with water (enough to the 75% to 80% fill level) of an autoclave (similar to the embodiment illustrated in FIG. 5).

Band heaters on the autoclave were operated to maintain the lower heating zone at about 650° C. and the upper heating zone at about 600° C. A growth pressure of about 25,000 psi was maintained. Growth continued for 7 days.

Resultant and spontaneously nucleated $UO_2$ crystals were approximately 0.25 mm in size.

EXAMPLE 3

Uranium dioxide crystals were synthesized using a $CaF_2$ seed crystal. The orientation of the seed crystal may vary, but may generally be (100) and (111) and, preferably, (110). Additionally, a miscut of ranging from 2° to about 4° may be used where the nominal orientation is (100), (111), or (110). Synthesis occurred according to the method of Example 1; however, no thermal gradient was applied—that, is, the entire reaction was maintained at an isothermal temperature of 650° C. Moreover, as the reaction was isothermal, no baffle was used.

The $CaF_2$ seed crystal was suspended slightly above the $UO_2$ feedstock such that $UO_2$ nutrients could dissolve into the feedstock prior precipitation onto the seed crystal.

EXAMPLE 4

Uranium dioxide crystals were again synthesized using a $CaF_2$ seed crystal and with a thermal gradient according to embodiments of the present invention. As was described in Example 3, the orientation of the seed crystal was variable, but generally (100) and (111) and, preferably, (110). Additionally, a miscut of ranging from 2° to about 4° may be used where the nominal orientation is (100), (111), or (110).

Synthesis occurred according to the method of Example 1 with a thermal gradient of 60°.

The $CaF_2$ seed crystal was suspended slightly above the $UO_2$ feedstock such that $UO_2$ nutrients could dissolve into the feedstock prior precipitation onto the seed crystal.

Relatively large $UO_2$ crystals were formed in a relatively short amount of time under these conditions.

EXAMPLE 5

Rubidium uranium fluorophosphate crystals were successfully synthesized using a hydrothermal growth technique according to a method of the present invention. A mineralizer solution comprising 3.15 M $RbH_2PO_4$ and 6.3 M RbF was prepared and placed with a uranium feedstock in an ampoule. The total volume of the mineralizer solution with the feedstock was between 60% and 70% of the total ampoule volume.

The ampoule was welded shut and placed into an autoclave, similar to the embodiment illustrated in FIG. 2. Deionized water was added such that the total volume of the ampoule with the deionized water occupied 65% to 75% of the autoclave reaction chamber volume. The autoclave was pressurized to about 25,000 psi, which was maintained throughout the reaction time.

Heat was applied such that the lower region of the ampoule was maintained at about 650° C. while the upper region of the ampoule was maintained at about 600° C.

Resultant crystals were analyzed using a XtaLab mini ™ (Rigaku Corp., Tokyo, Japan) operating at room temperature with Mo kα, λ=0.71073, 50 kV, 12 mA, and 0.6 kW. Relevant crystal information is shown in Table 2, below.

TABLE 2

Crystal Data for $RbUPO_4F_2$ and $CsUPO_4F_2$

|  | Chemical Formula | |
|---|---|---|
|  | $CsUPO_4F_2$ | $RbUPO_4F_2$ |
| Crystal System | Monoclinic | Monoclinic |
| Space Group | $P2_1/m$ (no. 11) | $P2_1/m$ (no. 11) |
| a (Å) | 6.7891 (14) | 6.6770 (13) |
| b (Å) | 5.9910 (12) | 5.9420 (12) |
| c (Å) | 7.6040 (15) | 7.3470 (15) |
| α (°) | 90.00 | 90.00 |
| β (°) | 115.73 (3) | 114.07 (3) |
| γ (°) | 90.00 | 90.00 |
| Z | 2 | 2 |

EXAMPLE 6

Cesium uranium fluorophosphate crystals were successfully synthesized using a hydrothermal growth technique similar to Example 5 with the mineralizer solution comprising 3.15 M $CsH_2PO_4$ and 6.3 M CsF was prepared and placed with a uranium feedstock in an ampoule. Resultant crystal information is shown in Table 2, above.

Figure 7A:
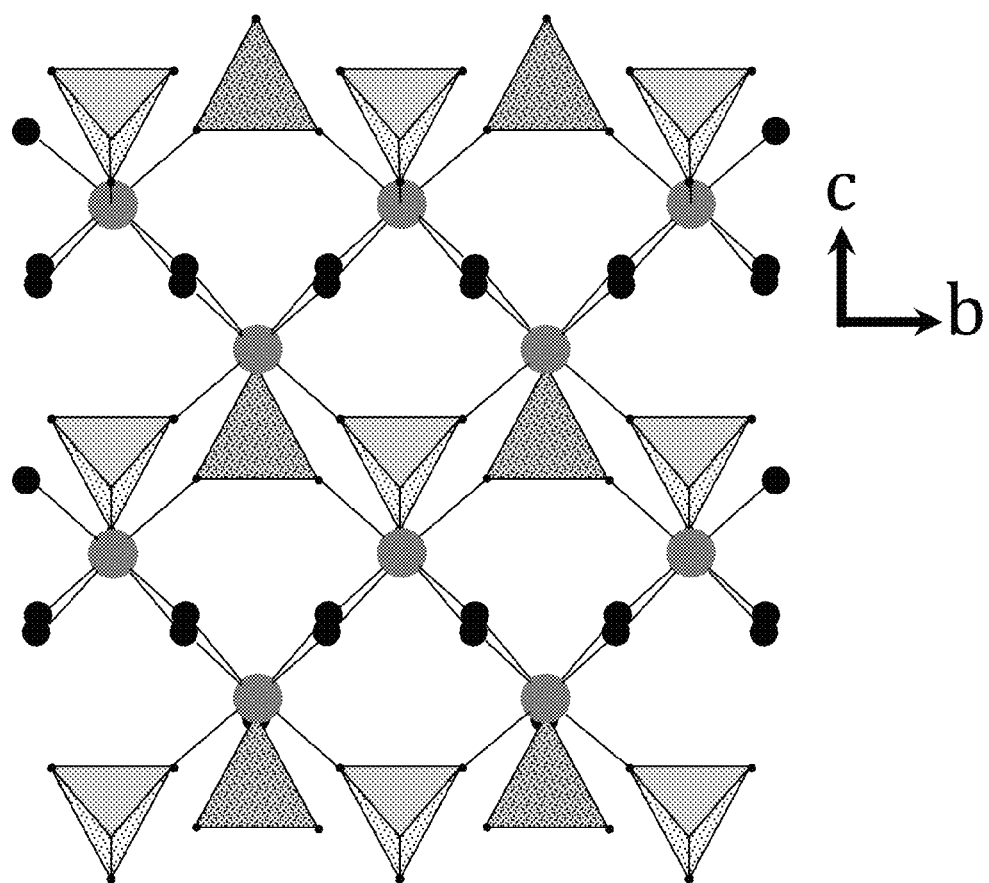
FIGS. 7A-7D are crystal structure representations of $RbUPO_4F_2$, $CsUPO_4F_2$, $Rb_7U_6F_{31}$, and $RbUF_5$ crystals, respectively, synthesized according to at least one embodiment of the present invention.
Figure 7B:
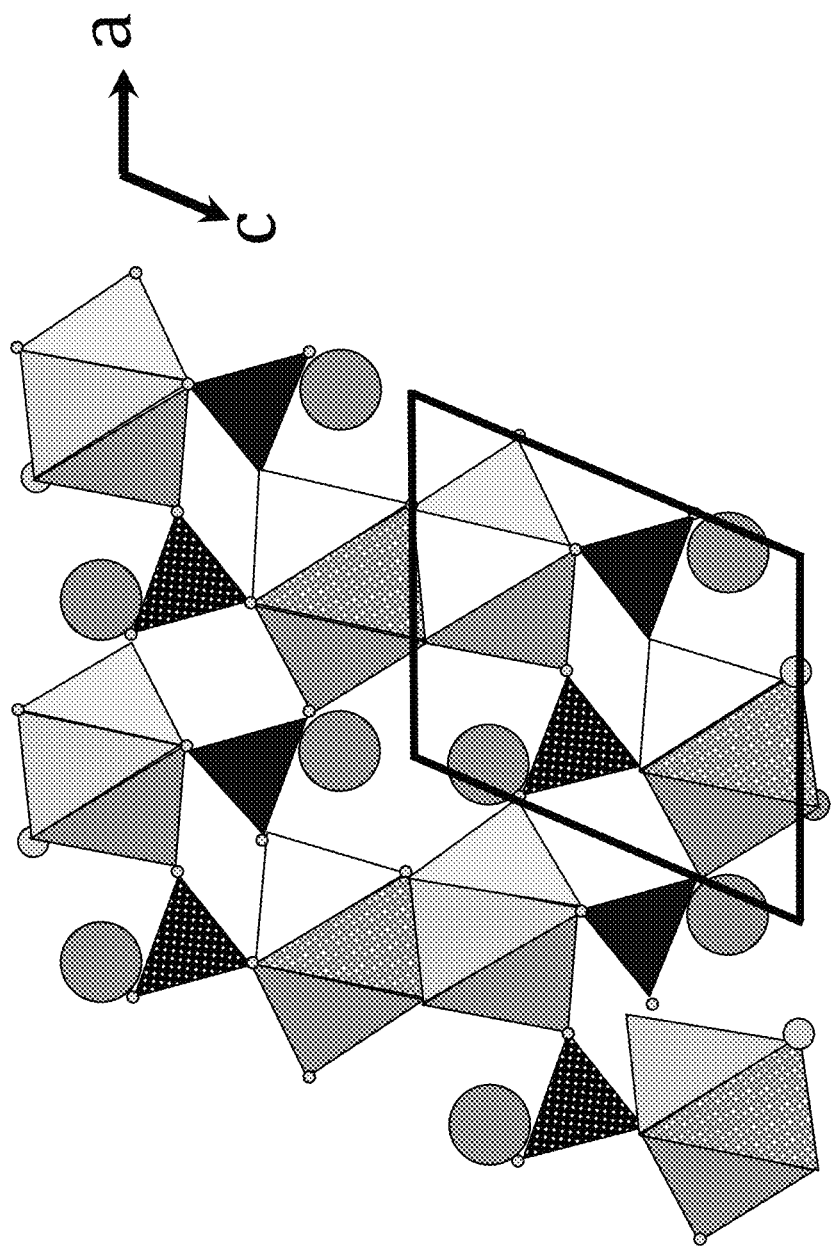

Exemplary crystal structure representations for $RbUPO_4F_2$ and $CsUPO_4F_2$ are shown in FIGS. 7A and 7B, respectively.

EXAMPLE 7

Rubidium uranium fluoride crystals ($Rb_7U_6F_{31}$) were successfully synthesized using a growth technique similar to Example 5. In that regard, a mineralizer solution comprising 2 M RbF and 1 M RbOH was prepared and placed with a uranium feedstock in an ampoule. Resultant crystal information is shown in Table 3, below.

Rubidium uranium fluoride crystals ($RbUF_5$) were successfully synthesized using a growth technique similar to Example 5. In that regard, a mineralizer solution comprising 0.1 M RbF and 0.05 M RbOH was prepared and placed with a uranium feedstock in an ampoule. Resultant crystal information is shown in Table 3, below.

Figure 7C:
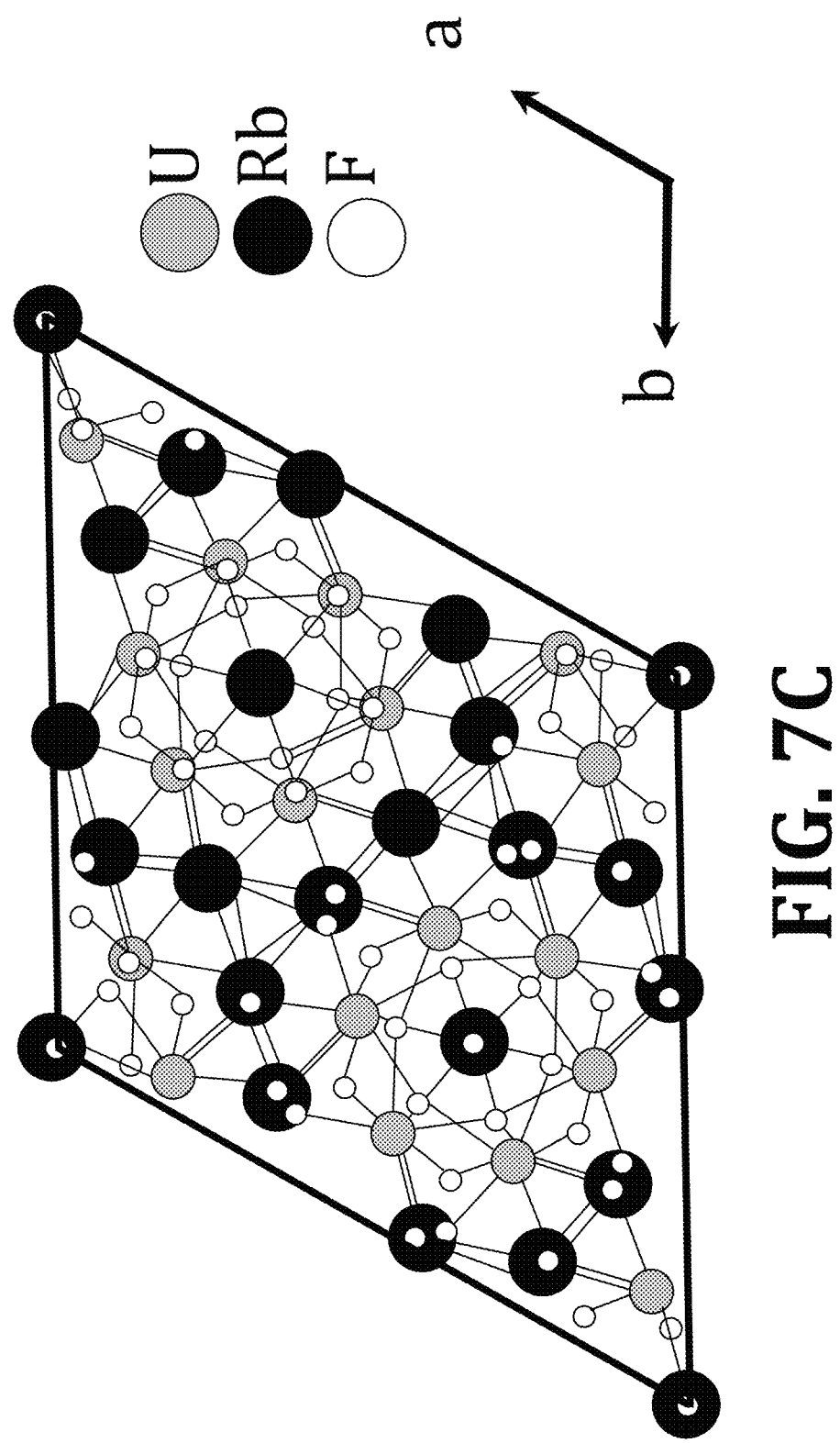
Figure 7D:
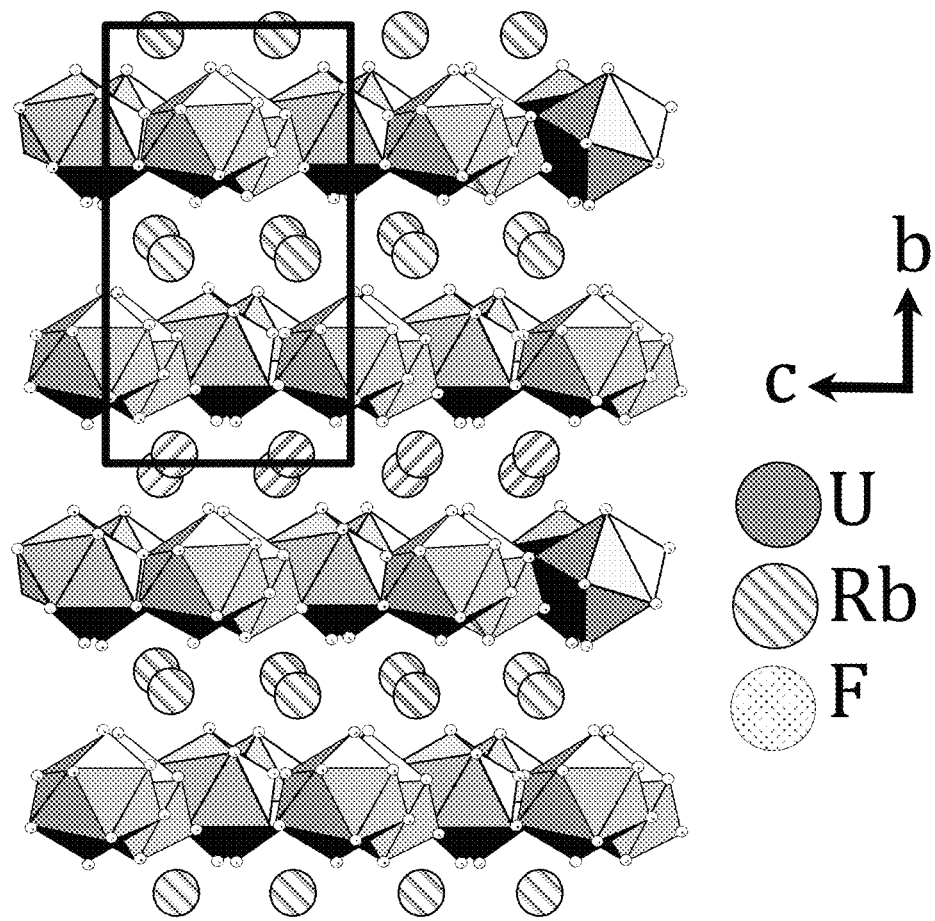

Exemplary crystal structure representations for $Rb_7U_6F_{31}$ and $RbUF_5$ are shown in FIGS. 7C and 7D, respectively.

TABLE 3

Crystal Data for $Rb_7U_6F_{31}$ and $RbUF_5$

|  | Chemical Formula | |
|---|---|---|
|  | $Rb_7U_6F_{31}$ | $RbUF_5$ |
| Crystal System | Rhombohedral | Monoclinic |
| Space Group | R-3 (no. 148) | $P2_1/c$ (no. 14) |
| a (Å) | 15.246 (2) | 8.2690 (17) |
| b (Å) | 15.426 (2) | 13.747 (3) |
| c (Å) | 10.715 (2) | 8.3560 (17) |
| α (°) | 90.00 | 90.00 |
| β (°) | 90.00 | 102.34 (3) |
| γ (°) | 120.00 | 90.00 |
| Z | 3 | 8 |

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of synthesizing alkali uranium fluorophosphate crystals, the method comprising:
    combining a uranium-based feedstock with a mineralizer solution comprising an alkali nutrient, a phosphate, and a fluoride;
    pressurizing the feedstock and the mineralizer solution; and
    applying a thermal gradient to the pressurized feedstock and the mineralizer solution such that a first portion of the feedstock and the mineralizer solution is heated to a temperature that is greater than a temperature of a second portion of the feedstock and the mineralizer solution,
    wherein uranium nutrient enters the mineralizer solution from the feedstock in the first portion and uranium nutrient precipitates to spontaneously form crystals in the second portion.

2. The method of claim 1, wherein the mineralizer solution comprises an alkali dihydrogen phosphate and an alkali fluoride.

3. The method of claim 1, further comprising:
    placing the feedstock with the mineralizer solution in an ampoule before pressurizing.

4. The method of claim 1, positioning a baffle in the ampoule and between the first and second portions.

5. An alkali uranium fluorophosphate crystal synthesized in accordance with the method of claim 1.

6. The alkali uranium fluorophosphates crystal of claim 5 having the formula $RbUPO_4F_2$ or $CsUPO_4F_2$.

7. A method of synthesizing rubidium uranium fluorophosphate crystals, the method comprising:
combining a uranium-based feedstock with a mineralizer solution comprising a rubidium nutrient, a phosphate, and a fluoride;
pressurizing the feedstock and the mineralizer solution; and
applying a thermal gradient to the pressurized feedstock and the mineralizer solution such that a first portion of the feedstock and the mineralizer solution is heated to a temperature that is greater than a temperature of a second portion of the feedstock and the mineralizer solution,
wherein uranium nutrient enters the mineralizer solution from the feedstock in the first portion and uranium nutrient precipitates to spontaneously form crystals in the second portion.

8. The method of claim 7, wherein the mineralizer solution comprises $RbH_2PO_4$ and RbF.

9. The method of claim 7, further comprising:
placing the feedstock with the mineralizer solution in an ampoule before pressurizing.

10. The method of claim 7, positioning a baffle in the ampoule and between the first and second portions.

11. A rubidium uranium fluorophosphate crystal synthesized in accordance with the method of claim 7.

12. The rubidium uranium fluorophosphate crystal of claim 11 having the formula $RbUPO_4F_2$.

13. A method of synthesizing cesium uranium fluorophosphate crystals, the method comprising:
combining a uranium-based feedstock comprising uranium dioxide with a mineralizer solution comprising a cesium nutrient, a phosphate, and a fluoride;
pressurizing the feedstock and the mineralizer solution; and
applying a thermal gradient to the pressurized feedstock and the mineralizer solution such that a first portion of the feedstock and the mineralizer solution is heated to a temperature that is greater than a temperature of a second portion of the feedstock and the mineralizer solution,
wherein uranium nutrient enters the mineralizer solution from the feedstock in the first portion and uranium nutrient precipitates to spontaneously form crystals in the second portion.

14. The method of claim 13, wherein the mineralizer solution comprises $CsH_2PO_4$ and CsF.

15. The method of claim 13, further comprising:
placing the feedstock with the mineralizer solution in an ampoule before pressurizing.

16. The method of claim 13, positioning a baffle in the ampoule and between the first and second portions.

17. A cesium uranium fluorophosphate crystal synthesized in accordance with the method of claim 13.

18. The cesium uranium fluorophosphate crystal of claim 17 having the formula $CsUPO_4F_2$.

* * * * *